United States Patent [19]

Mohan Rao

[11] Patent Number: 5,452,244
[45] Date of Patent: Sep. 19, 1995

[54] ELECTRONIC MEMORY AND METHODS FOR MAKING AND USING THE SAME

[75] Inventor: G. R. Mohan Rao, Dallas, Tex.

[73] Assignee: Cirrus Logic, Inc., Fremont, Calif.

[21] Appl. No.: 288,580

[22] Filed: Aug. 10, 1994

[51] Int. Cl.$^6$ .............................................. G11C 11/24
[52] U.S. Cl. ................................. 365/149; 365/230.06
[58] Field of Search .................. 365/149, 174, 189.01, 365/189.05, 189.12, 230.06

[56] References Cited

U.S. PATENT DOCUMENTS 4,710,896 12/1987 Nagami ................................ 365/149
5,341,326 8/1994 Takase et al. ........................ 365/149
5,359,566 10/1994 Furuyama ........................... 365/149
5,369,612 11/1994 Furuyama ....................... 365/149 X

*Primary Examiner*—Joseph A. Popek
*Attorney, Agent, or Firm*—Winstead, Sechrest & Minick

[57] ABSTRACT

A memory 200 is provided which includes a plurality of bitlines 204, a plurality of wordlines 203, and an array 202 of rows and columns of multi-bit storage locations 201. Each location 201 includes a plurality of cells 209 for storing data presented on an associated bitline 204 in response to a plurality of control signals, at least one of the storage cells of 209 of each storage location 201 receiving a corresponding one of the control signals from an associated wordlines 203.

21 Claims, 8 Drawing Sheets

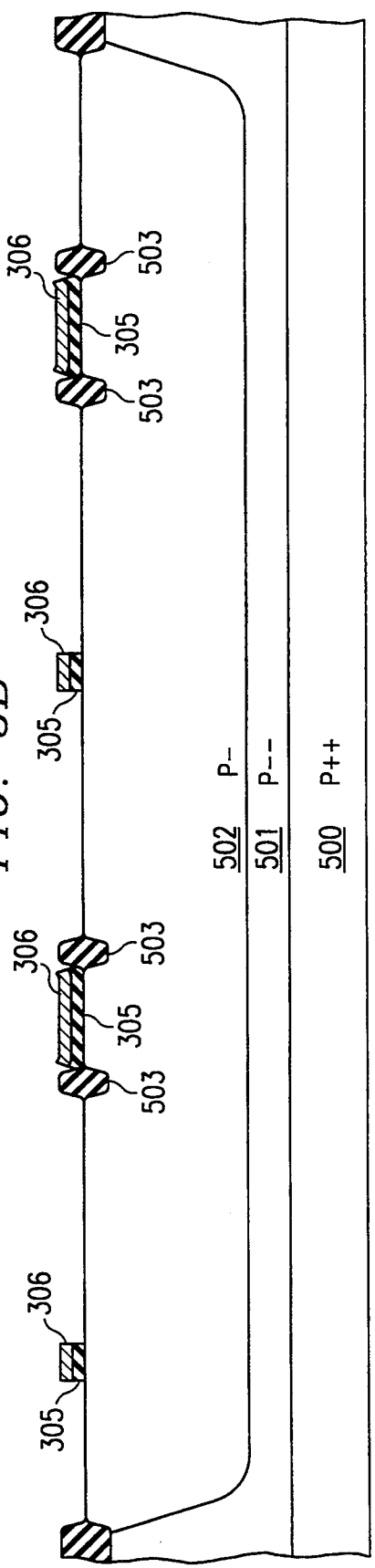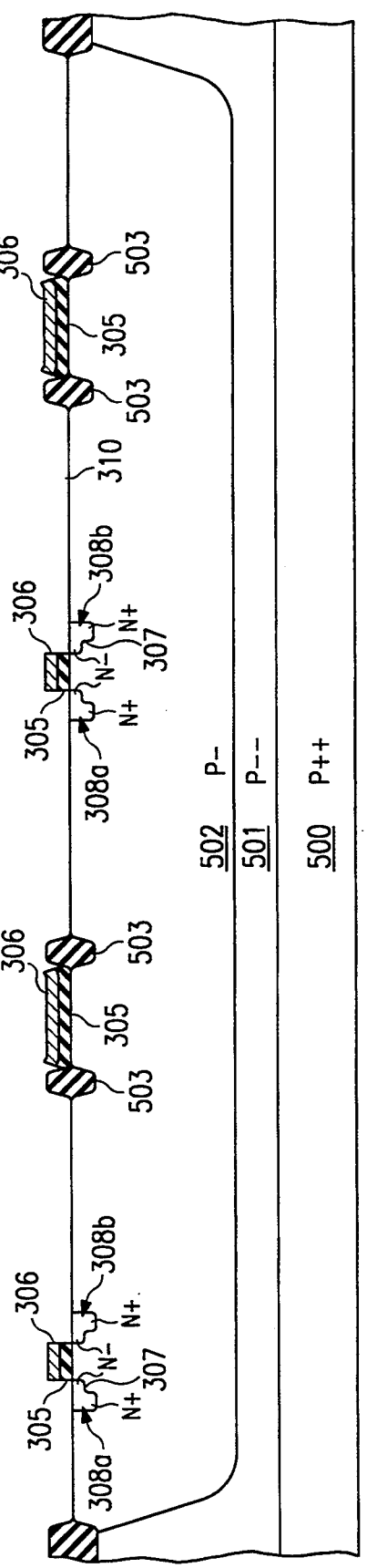

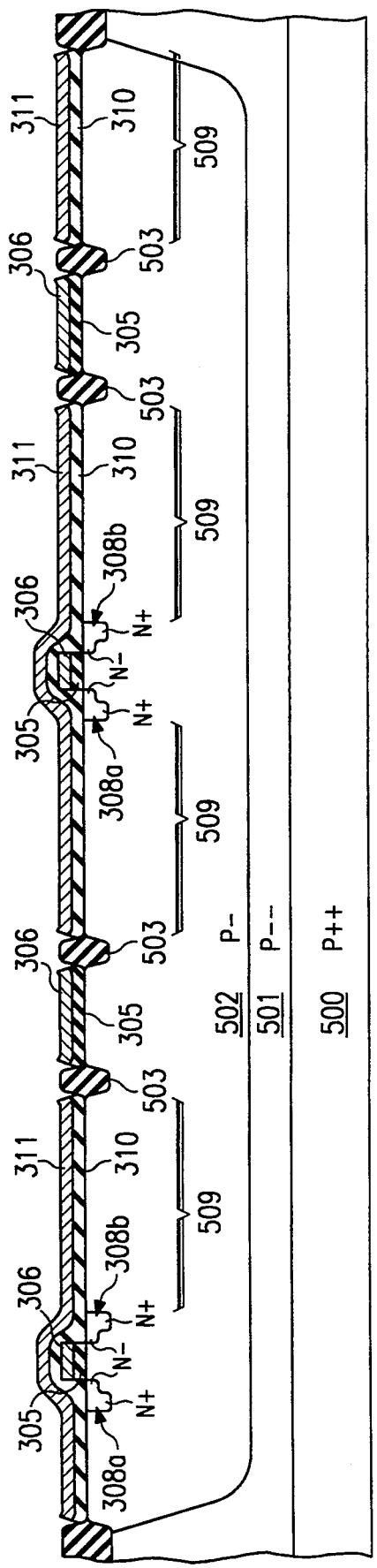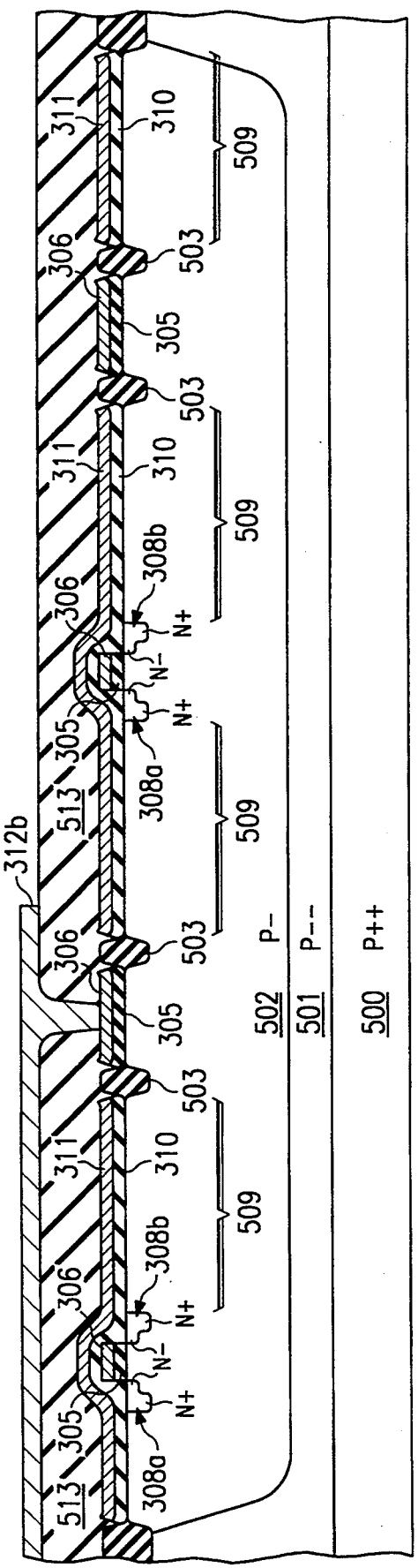

ELECTRONIC MEMORY AND METHODS FOR MAKING AND USING THE SAME

TECHNICAL FIELD OF THE INVENTION

The present invention relates in general to digital electronic circuits and systems and in particular to an improved memory and methods for making and using the same.

BACKGROUND OF THE INVENTION

A typical processing system with video/graphics display capability includes a central processing unit (CPU), a display controller coupled with the CPU by a system bus, a system memory also coupled to the system bus, a frame buffer coupled to the display controller by a local bus, peripheral circuitry (e.g., clock drivers and signal converters), display driver circuitry, and a display unit. The CPU generally provides overall system control and, in response to user commands and program instructions retrieved from the system memory, controls the contents of graphics images to be displayed on the display unit. The display controller, which may for example be a video graphics architecture (VGA) controller, generally interfaces the CPU and the display driver circuitry, exchanges graphics and/or video data with the frame buffer during data processing and display refresh operations, controls frame buffer memory operations, and performs additional processing on the subject graphics or video data, such as color expansion. The display driver circuitry converts digital data received from the display controller into the analog levels required by the display unit to generate graphics/video display images. The display unit may be any type of device which presents images to the user conveying the information represented by the graphics/video data being processed. The "display" may also be a printer or other document view/print appliance.

The frame buffer and system memory are typically constructed from read/write memory devices such as dynamic random access memories (DRAMs). These devices are typically arranged as rows and columns of cells, with a single bit storage cell disposed at each intersection of a row and a column. In most video and graphics applications, words of data (of 8, 16, 32 or more bits in length) are stored in adjacent cells in the array—namely in adjacent cells along the same row. Page mode accessing is then typically used to access one or more words from a given row during a single address cycle to improve processing speed. During a DRAM page mode access (either a read or a write), a row address is presented to the device address port and latched in with a row address strobe (RAS) to select a given row in the array. A column address is next presented to the address port and latched in with a column address strobe (CAS) to select a first column thereby allowing access to a first cell (bit) along the selected row. Column decode (static or dynamic) circuitry then increments from the received column address to generate a sequence of column addresses to adjacent columns, thereby allowing access to a "page" of cells (bits) along the selected row.

While the page mode allows for faster access, implementing it has substantial disadvantages. First, the RAS and CAS signals must be maintained low to latch the initial row and column addresses; CAS must be cycled for each page bit, the amount of time RAS and CAS are held low is limited (currently to approximately 10 $\mu$sec maximum) due to the "dynamic" nature of the DRAM peripheral circuitry (e.g., on chip clocks). This limitation in turn limits the number of bits (cells) which may be accessed during a single page cycle. Further, the need to increment through the page on a single column by column basis increases cycle time per page. Finally, currently available DRAMs operating in the page mode do not allow random access of any desired specific bits along a given row and therefore typically a random access cycle may have been performed to access a selected bit.

Improved DRAMs with page mode access, such as the fast page mode and ultra fast page mode DRAMs, have been developed which provide for even faster access to pages of bits. These devices achieve the additional speed by replacing some of the clocked elements used in conventional page mode DRAM to transfer data from the columns to the data I/O pins with static devices. While this technique eliminates some of the gate delays in the data path, the use of static devices increases power consumption.

Thus, the need has arisen for an improved read/write memory with page mode access. Such a memory should allow for the fast access of long pages without consuming an excess of power. Further, such a memory should allow for the access of a selected bit or bits without the need to perform a full page cycle or random access. Finally, such a memory should be adapted for particular application in graphics and video data processing systems.

SUMMARY OF THE INVENTION

The principles of the present invention provide for the construction of an improved read/write memory device with page mode access capabilities. In general, an array of rows and columns of multiple-cell storage locations are provided with each row associated with at least one row line conductor (wordline) and each column associated with a column line conductor (bitline). The cells of each storage location allow for the storage and retrieval of bits of data presented on the column line associated with the corresponding column of cells in response to access control signals provided to each cell. At least one of the cells receives a corresponding one of these control signals from the row line associated with the corresponding row of cells.

According to one embodiment of the present invention, a memory is provided which includes a plurality of storage locations each comprising a plurality of transistors each having a current path and a control input for controlling current flow through the current path. The current paths of the transistors of a selected storage location are coupled together in series with a data source and the control input of each transistor in said location coupled to a separate control signal source. Each storage location also includes a plurality of capacitors, each of the capacitors coupled between a preselected voltage and the current path of a corresponding one of the transistors.

According to another embodiment of the present invention, a memory is provided which includes a plurality of multi-bit storage locations disposed in an array of rows and columns. A column line is associated with each column of storage locations and at least one row line is associated with each row of storage locations. Each multi-bit storage location includes a first field effect transistor having a source/drain path coupled to the column line associated with the corresponding column and a gate coupled to row line associated with the corresponding row. Each storage location also includes at least one other field effect transistor having a source/drain path coupled in series with the source/drain path of the first transistor and a gate coupled to a control signal source. A plurality of data storage capacitors are provided each coupled to the source/drain path of a corresponding one of the transistors.

The principles of the present invention are additionally embodied in a memory system. An array of multi-bit data storage locations are provided arranged in X number of rows and Y number of columns disposed at an angle to the rows. A plurality of bitlines are included each of which is associated with a column of storage locations. A plurality of wordlines are provided, at least one of which is associated with each row of storage locations. Column decoder circuitry and sense amplifier circuitry is coupled to each of the bitlines. Row decoder circuitry is coupled to each of the wordlines. Each of the multi-bit storage locations includes Z number of transistors, each transistor having a source/drain path and a gate. The source/drain paths of the transistors of a selected location are coupled in series with the bitline associated with the corresponding column with the gate of a first one of said transistors coupled to the wordline associated with the corresponding row. The gates of the other ones of the transistors of the selected location are coupled to separate control signal sources. Z number of capacitors are provided per each storage location, each capacitor coupled to a pre-selected voltage and to the source/drain path of a corresponding one of the transistors in the storage location.

Methods are also provided for reading and writing data to from and to memory locations constructed in accordance with the principles of the present invention. In particular, a method is provided for writing data to first and second cells of a multi-cell data storage location which includes a plurality of transistors, each having a current path and control input, and a plurality of capacitors. The current paths of the transistors of a given storage location are coupled in series. Each capacitor is coupled to a preselected voltage and to a current path of a corresponding one of the transistors. A first bit of data is presented to the current path of a first one of the transistors. A voltage is applied to the control input of the first transistor to transfer the first bit to a first one of the capacitors. A voltage is then applied to the control input of a second transistor, the current path of the second transistor coupling the first capacitor with a second one of the capacitors, to transfer the first bit from the first capacitor to the second capacitor. The voltage applied to the control input of the second capacitor is removed and a second bit of data is presented to the current path of the first transistor for transfer to the first capacitor.

A method is provided for reading data from first and second cells of a multi-cell data storage location, the storage location including a plurality of transistors having current paths coupled together in series, with each of the transistors further including control signal input, and a plurality of capacitors, each capacitor coupled to a preselected voltage and to a current path of a corresponding one of the transistors. A bitline is coupled to the current path of the first transistor and to associated sensing circuitry. A voltage representing a first bit has been stored on a first one of the capacitors and a voltage representing a second bit has been stored on a second one of the capacitors. A voltage is applied to the control input of the first transistor to couple the voltage representing the first bit from the first capacitor through the current path of the first transistor to the bitline. The change in voltage on the bitline is then sensed. Voltage is applied to the control input of the second transistor to transfer the voltage representing the second bit from the second capacitor through the current paths of the first and second transistors. The change in voltage on the bitline is then sensed.

Memories embodying the principles of the present invention are particularly useful in applications requiring page mode access. By accessing one or more storage locations a plurality of bits (or words) an be rapidly accessed using only a small number of full address cycles. Further, such memories provide fast access of even long pages without consuming an excess of power since a number of bits can be accessed from each location addressed during the active periods of RAS and CAS. Further, such memories should allow for rapid access of selected bits or bit without the need to perform a full page cycle. Finally, it should be recognized that the sense amplifiers consume 40 to 50% (approximately) of the operating power in a DRAM. In a conventional DRAM, there is one sense amplifier for each column, with only a single bit stored at the intersection one column with one row. In the present invention, there are 4 bits (example) sharing the same sense amplifier; thus reducing overall operating power.

The principles of the present invention further allow for the fabrication of memory circuits and systems employing such multi-bit storage locations. In a first fabrication embodiment, a multi-bit data storage location is formed at the face of a layer of semiconductor of a first conductivity type. A first transistor having a source/drain region of a second conductivity type is formed in the layer and includes a gate disposed insulatively adjacent a first channel area of the layer laterally adjacent the source/drain. A second transistor is provided having a gate disposed insulatively adjacent a second channel area of the semiconductor layer. A first capacitor conductor is disposed insulatively adjacent a first capacitor area of the semiconductor layer, the first capacitor area is disposed lateral to the first channel area. A second capacitor conductor is disposed insulatively adjacent a second capacitor area of the semiconductor layer, the second capacitor area disposed lateral to the second channel area.

According to another fabrication embodiment, a multi-bit data storage location is fabricated at the face of a layer of semiconductor of a first conductivity type. A plurality of transistors are included, each having at least one source/drain region formed in the layer of semiconductor to be of a second conductivity type and a gate disposed insulatively adjacent a corresponding channel area of the layer. A capacitor area of the semiconductor layer is disposed laterally adjacent each of the transistors. A capacitor conductor is disposed insulatively adjacent each of the capacitor areas and is coupled to a preselected voltage. A conductive line is coupled to each date of each of the transistors.

The principles of the present invention also provide for the fabrication of a memory including an array of multiple bit storage locations arranged in a plurality of rows and columns and formed at a face of a layer of semiconductor of a first semiconductor type. A plurality of wordline conductors are included, at least one associated with each row of storage locations. A plurality of bitline conductors are provided, each associated with a column of cells. Row decoder circuitry is coupled to at least selected ones of the wordlines and column decoder and sense amplifier circuitry is coupled to the bitlines. Each of the storage locations includes a first transistor having a source/drain region formed in the layer of a second semiconductor type and a first gate conductor controlling a first channel area of the layer adjacent the source/drain. The source/drain of the first transistor forms a portion of the bitline of the associated column of cells. A first capacitor conductor is provided for the storage location disposed insulatively adjacent a first capacitor area of the layer of semiconductor, the first capacitor area is disposed such that a voltage applied to the first gate controls the transfer of charge between the first source/drain and the first capacitor area. Each storage location also includes a second transistor having a second gate disposed insulatively adjacent a second channel area of the semiconductor layer and a second capacitor conductor disposed insulatively adjacent a second capacitor area of the semiconductor layer, the second capacitor area being disposed such that a voltage applied to the second gate controls the transfer of charge between the first capacitor area and the second capacitor area.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5A–5F are a series of sectional views taken along line 5—5 of FIG. 4 depicting the fabrication of storage location 201.

DETAILED DESCRIPTION OF THE INVENTION

Figure 1:
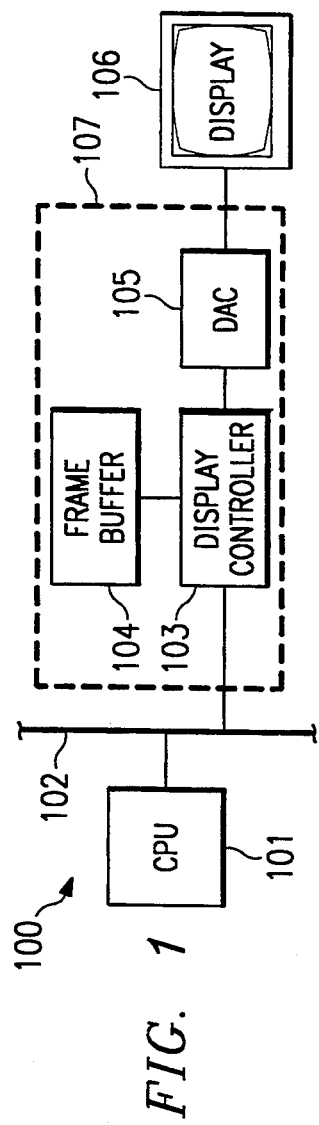
FIG. 1 is a functional block diagram of a processing system.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. Display controller 103, frame buffer 104 and DAC 105 may fabricated together on a single integrated circuit chip 107 or on separate chips.

CPU 101 controls the overall operation of system ("master") 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an IA bus or a PCI bus. DAC 105 receives digital data from controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device displays images on a display screen as a plurality of pixels. Further, display 106 may be a state-of-the-art device such as a digital micromirror device or a silicon carbide like device (as described in the January 1994 issue of the IEEE *Spectrum*) which directly accepts digital data. It should also be noted that in alternate embodiments, "display" 106 may be another type of output device such as a laser printer or similar document view/print appliances.

Figure 2A:
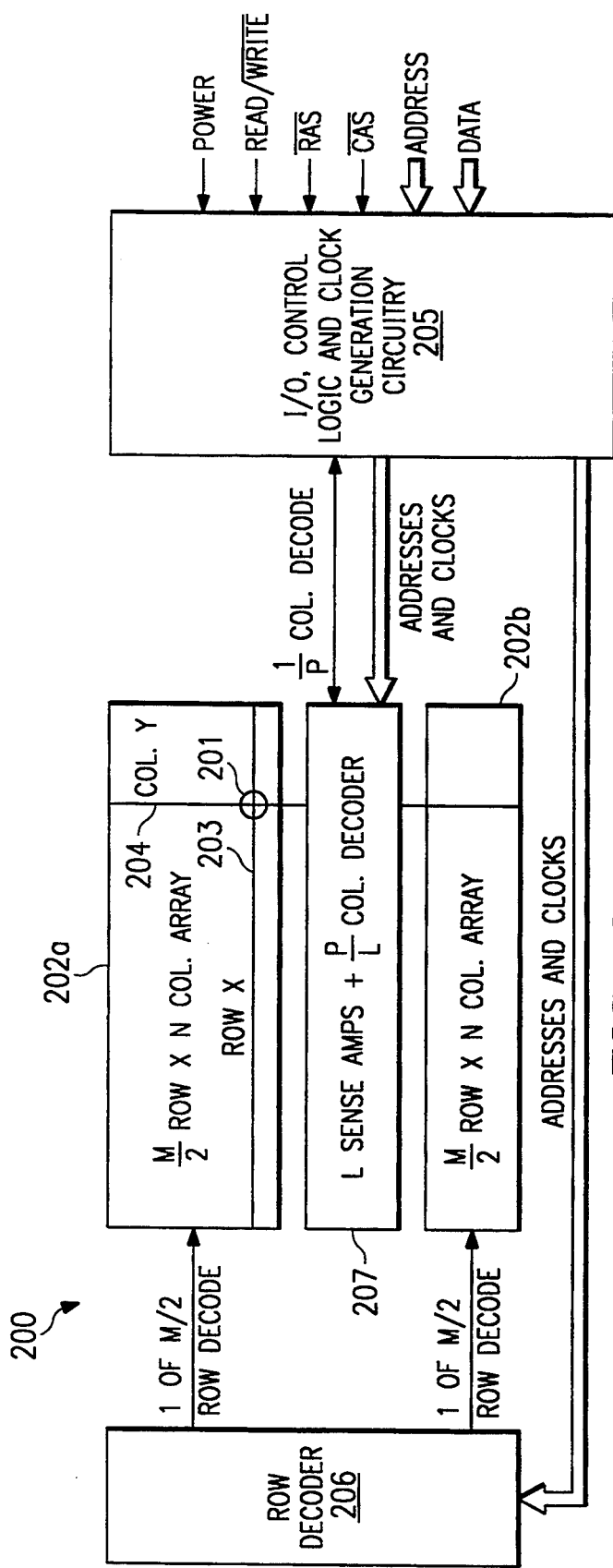
FIG. 2 is a functional block diagram of a read/write memory device embodying the principles of the present invention and suitable for construction of the frame buffer depicted in FIG. 1.
FIG. 2B is an electrical schematic diagram of a selected one of the storage locations 201, of the array 202a–b depicted in FIG. 2A, disposed at the intersection of row X and column Y, according to a first embodiment of the present invention.
FIG. 2C is an electrical schematic diagram of a selected adjacent pair of the storage locations 201 of the array 202a–b depicted in FIG. 2A, disposed at the intersections of row X and column Y and row X and column Y+1, according to a second embodiment of the present invention.

FIG. 2a is a functional block diagram of a dynamic random access memory (DRAM) 200 embodying the principles of the present invention. In the system illustrated in FIG. 1, DRAM 200 is used to construct frame buffer 104, however, it should be recognized that DRAM 200 is suitable for wide range of applications, and in particular to those applications requiring page mode accesses. DRAM 200 includes a plurality of storage locations 201 arranged in two arrays 202a and 202b. Each array 202 includes M/2 number of rows and N number of columns of locations 201 with each location 201 being disposed at the intersection of a row and a column. Each row of locations 201 is associated with at least one conductive row line (wordline) 203 and each column of locations 201 is associated with a conductive column line 204. A selected location 201, row line 203 (associated with a row X) and column line 204 (associated with a column Y) are depicted in FIG. 1 for reference. Control circuitry 205 controls the input of addresses, the input and output of data, and the input of power and control signals, such as RAS, CAS and read/write select. Row decoding is controlled by row decoder 206 in response to received row addresses. In the illustrated embodiment, row decoder 206 selects one row line 203 from either array 202a or 202b. Column decoder/sense amplifier circuitry 207 is coupled to the bitlines 204 of each array 202a–202b. In the illustrated embodiment, circuitry 207 includes L number of sense amplifiers and a P/L column decoder. Preferably one sense amplifier is included for each of the N columns in the arrays 202 and 202b. It should be noted that the sense amplifiers may be multiplexed in alternate embodiments. For example, L may equal N/2 where each sense amplifier is switchable between a pair of bitlines 204. The P/L decoder of the illustrated embodiment couples one out of P columns with control circuitry 205 such that a single storage location 201 is accessed per address (i.e., the illustrated memory 200 is a "by 1" memory). It should be noted that memory 200 could be organized as a by 4, by 8, by 16 or other multi-location 201 access memory. For example, the P/L decoder may be constructed to select 8 out of P columns/sense amplifiers with control circuitry 205 such that 8 storage locations 201 can be accessed per address (i.e., memory 200 is a "by 8" memory).

Figure 2B:
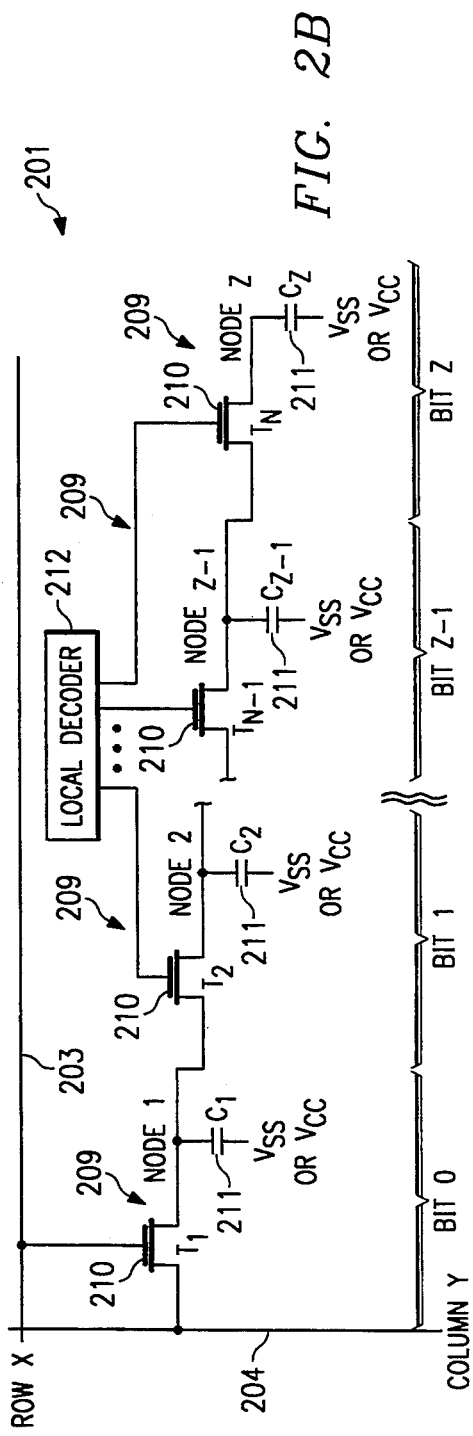

FIG. 2b is an enlarged depiction of a selected location 201 at the intersection of row X and column Y. As depicted in FIG. 2b, each storage location 201 includes Z number of series coupled memory cells 209 for storing Z number of bits. Each cell 209 includes an access transistor 210 and a data storage capacitor 211. In the preferred embodiment, transistors 208 are field effect transistors (labelled $T_1$-$T_z$ for purposes of the present discussion) having their source/drain (current) paths coupled in series. The source/drain path of a first transistor 210 ($T_1$) is coupled to the bitline 205 associated with column Y. The gate (control input) of the first transistor 210 ($T_1$) is coupled to the corresponding row X row line (wordline) 202 while the gates of the remaining transistors 210 ($T_2$-$T_z$) are coupled to a local decoder 212 in the embodiment illustrated in FIG. 2b. An inversion layer parallel plate dielectric capacitor 211 (labelled $C_1$-$C_z$ for discussion) is coupled between a node (Node 1-Node Z) associated with a corresponding transistor 210 ($T_1$-$T_z$) and Vss or Vcc.

Data can be written into and read out of the cells 209 of a selected location 201 by shifting voltages between the capacitors 211 and the associated column line 204. During a write, the data may be shifted into each cell 209 in reverse order in its true logic state or in proper order in its complementary state. For purposes of illustrating the reading and writing of data using the circuitry depicted in FIG. 2b, the variable Z will be assumed to equal 4. (i.e. four cells 209 being provided per location 201). Further, it will be assumed that the four-bit word (BIT0-BIT3) being read/written is in its true logic state and that writing to the cells 209 is in reverse order. Finally, it should be recognized that, preferably, during the reads and writes discussed below, transitions are turned off during a given step before transistors are turned on.

To start a write cycle, a voltage representing BIT3 (i.e., a logic 1 or logic 0) is applied to column Y bitline 204 and row X wordline 203 is set high to turn on transistor $T_1$ and set the voltage on capacitor $C_1$ to BIT3. In the second step, the wordline 203 for row X is deactivated to shut off transistor $T_1$ and local decoder 212 turns on transistor $T_2$ to shift BIT3 from capacitor $C_1$ to capacitor $C_2$. In the third step, local decoder 212 turns off transistor $T_2$ and activates transistor $T_3$ (labeled $T_{z-1}$ in FIG. 2b) thereby shifting BIT3 to capacitor $C_3$. At the same time, row X wordline 203 is activated to turn on transistor $T_1$ and a voltage representing BIT2 shifted from column Y bitline 204 to capacitor $C_1$. In the fourth step, transistor $T_1$ is turned off and transistor $T_2$ turned on to shift BIT2 to capacitor $C_2$. Also during the fourth step, transistor $T_3$ is turned off and transistor $T_4$ turned on to shift BIT3 from capacitor $C_3$ to capacitor $C_4$. During the fifth step, transistor $T_2$ is turned off and transistor $T_1$ is once again turned on to shift a voltage representing BIT1 from column Y bitline 204 to capacitor $C_1$. At the same time, transistor $T_3$ is turned on to shift BIT2 from capacitor $C_2$ to capacitor $C_3$. In the sixth step, transistor $T_1$ is turned off and transistor $T_2$ is turned on to shift BIT1 from capacitor $C_1$ to capacitor $C_2$. Transistor $T_3$ is also turned off. In the last (seventh) step, transistor $T_1$ is turned on and transistor $T_2$ is turned off such and a voltage representing BIT0 applied to the column Y wordline 204 is shifted to capacitor $C_1$. At the end of the write cycle, transistor $T_1$ is turned off.

To start a read cycle, the bitline 204 associated with column Y is precharged to a selected voltage. Transistor $T_1$ is turned on and the effect on the bitline voltage caused by the coupling of the selected bitline 204 to capacitor $C_1$ is sensed to read BIT0; if capacitor $C_1$ has been pulled down (set low) during the write cycle the corresponding sense amplifier will detect a substantial drop in voltage on the corresponding bitline 204 and reads BIT0 as a logic 0 and if capacitor $C_1$ has been pulled up (set high) during the write cycle the corresponding sense amplifier detects little or no drop in voltage on the corresponding bitline 204 thereby reading BIT0 as a logic 1. In the second step, transistor $T_1$ is turned off and transistor $T_2$ is turned on such that bit BIT1 is shifted from capacitor $C_2$ to capacitor $C_1$. During step three, transistor $T_2$ is turned off, transistor $T_1$ turned on, and BIT1 sensed on the column Y bitline 204. At the same time, transistor $T_3$ is turned on to shift bit BIT2 from capacitor $C_3$ to capacitor $C_2$. During the fourth step, transistor $T_1$ is turned off and transistor $T_2$ turned on to shift bit BIT2 from capacitor $C_2$ to capacitor $C_1$ and transistor $T_3$ is turned off and transistor $T_4$ is turned on to transfer bit BIT3 from capacitor $C_4$ to capacitor $C_3$. At step five, transistor $T_2$ is turned off and transistor $T_1$ is turned on, and bit BIT2 is sensed on the column Y bitline 204. Also during the fifth step, transistor $T_4$ is turned off and transistor $T_3$ is turned on to shift bit BIT3 to capacitor $C_2$. During step six, transistors $T_1$ and $T_3$ are turned off and transistor $T_2$ is turned on to shift bit BIT3 from capacitor $C_2$ to capacitor $C_1$. During the last step (step seven), transistor $T_1$ is turned on and bit BIT3 is sensed on column Y bitline 204.

In the preferred embodiment, each bit read out of a given storage location 201 is stored in a register until all the bits from that storage location 201 have been output. The entire word in the register can then be transferred in parallel to another processing device. For example, in the case of system 100, each storage location 201 may store a word (or portion thereof) of pixel data. The bits of a given pixel word are read out of the corresponding storage location 201 in serial, as described above, reassembled into a parallel word in a register, and then transferred as a word under the control of display controller 103.

When reads and writes are performed by the shifting method described above, 2Z-1 steps are required to perform a complete read or write of a given storage location 201. In the worst case, where local decoder 212 activates and deactivates the gates of the associated transistors 210 with the "master clock" which controls the charging/discharging of row lines 203 and column lines 204, 2Z-1 clock cycles are required to perform the required 2Z-1 steps in a read or write operation; however, if local decoder 212 operates a clock rate faster than master clock, the number of clocks required for a complete read/write operation can be reduced. For example, in the write mode discussed above, BIT3 can transferred from the column Y bitline 204 to capacitor $C_1$ with the first master clock cycle in the write cycle and then shifted to capacitor $C_2$ (or even beyond to capacitors $C_3$ or $C_4$) by local decoder 212 before BIT2 is shifted to capacitor $C_1$ with the next master clock cycle, and so on. In embodiments employing this shifting scheme, a read or write of all cells in a location 209 will only consume Z clock periods.

Writes and reads to each storage cell 209 in a selected location 201 can also accomplished by directly coupling the corresponding column line 204 with the capacitors 211. This method is also best illustrated in conjunction with FIG. 2b for the case where each location includes four storage cells 209 (i.e. Z=4). This method is generally faster but requires more sensitive sense amplifiers.

At the start of a write cycle, the first bit of data BIT3 is set on column line Y and all transistors $T_1$–$T_4$ are turned on such that the voltage on capacitors $C_1$–$C_4$ is either pulled down by the bitline 204 associated with column Y (logic 0) or pulled up by that bitline 204 (logic 1). Transistor $T_4$ is then turned off to hold BIT3 in capacitor $C_4$. BIT2 is applied to column Y bitline 204 to set capacitor $C_3$ to the desired voltage and transistor $T_3$ is then turned off. The process is repeated for BIT1; BIT1 is applied to the column Y bitline 204 to set the desired voltage on capacitor $C_2$ and then transistor $T_2$ is turned off. To complete the write cycle, BIT0 is applied to column Y bitline 204 to set capacitor $C_1$ to the desired voltage and then transistor $T_1$ is turned off.

To read data from storage cells, the process described immediately above is reversed. The bitline 204 associated with column Y is precharged. Transistor $T_1$ is turned on and the effect on the bitline voltage caused by coupling to capacitor $C_1$ is sensed to read BIT0; if capacitor $C_1$ has been pulled down during the write cycle the corresponding sense amplifier detects a substantial drop in voltage on the column Y bitline 204 and reads BIT0 as a logic 0 and if capacitor $C_1$ has been pulled up during the write cycle the corresponding sense amplifier detects little or no drop in voltage on the column Y bitline 204 and reads BIT0 as a logic 1. Bits BIT1, BIT2 and BIT3 are read in a similar fashion by sequentially turning on transistors $T_2$, $T_3$ and $T_4$ and sensing the change in voltage on bitline Y caused by successively coupling of capacitors $C_2$, $C_3$, and $C_4$ to the column Y bitline 204.

Figure 2C:
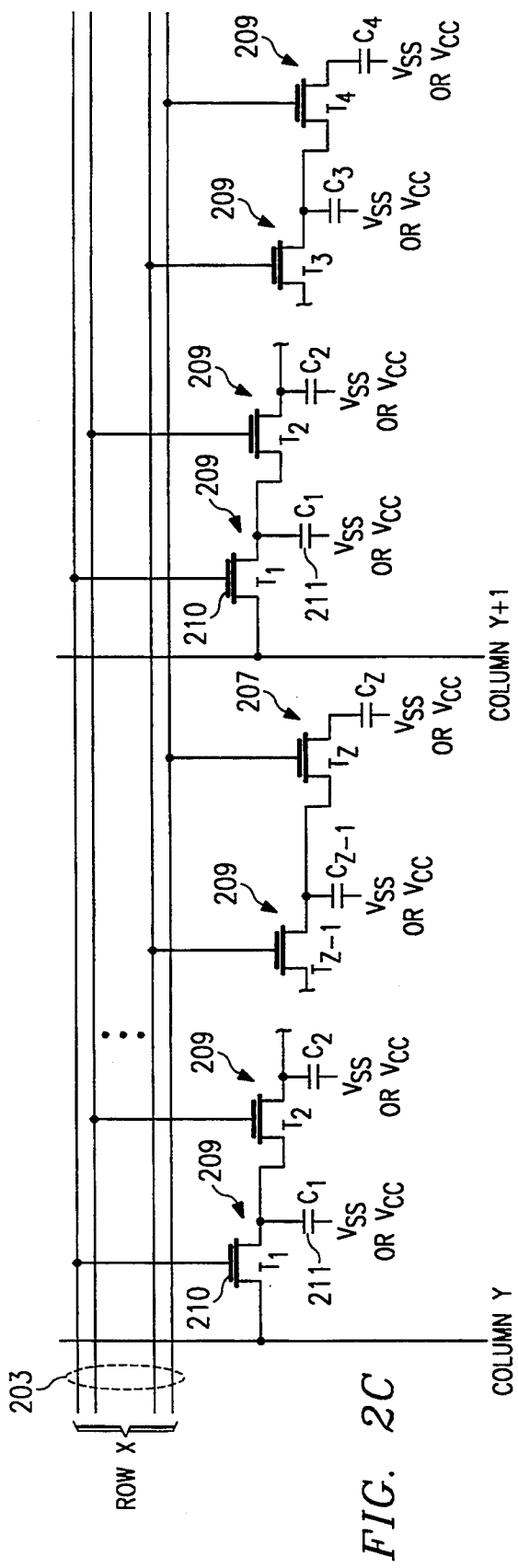

FIG. 2C depicts a pair of adjacent storage locations 201 according to an alternate embodiment of the present invention. In FIG. 2c the adjacent storage locations 201 are at the intersections of row X with column Y and column Y+1. In this embodiment, each row line (word-line) 203 comprises Z number of row lines (sub-row lines) 203, each coupling the gate of a corresponding transistor 210 of each location along the given row to row decoder 206. This embodiment eliminates local decoders 212 and provides for more direct accessing of individual bits. Notwithstanding the replacement of local decoder 212 with sub-row lines, the operation of the embodiment of FIG. 2C is essentially the same as that of the embodiment depicted in FIG. 2B.

Memories such as memory 200 which embody the principles of the present invention provide for particularly fast writes when all logic zeros or all logic ones are being stored. This situation may arise for example during the blanking of the screen of display 106 in system 100. During a write, a selected bitline 204 is activated and all the transistors 210 (i.e., transistors $T_1$–$T_4$) are turned on (by either the associated local decoder 212 or row decoder 206, depending on the embodiment) at substantially the same time. Since the capacitance of the bitlines 204 relative to capacitors 211 (i.e. capacitors $C_1$–$C_4$) is typically 15 to 20 times greater, the write will be very fast compared to the example write cycles discussed above.

Although the present invention and its advantages have been described in detail, it should be understood that various changes, substitutions and alterations can be made herein without departing from the spirit and scope of the invention as defined by the appended claims.

Figure 3:
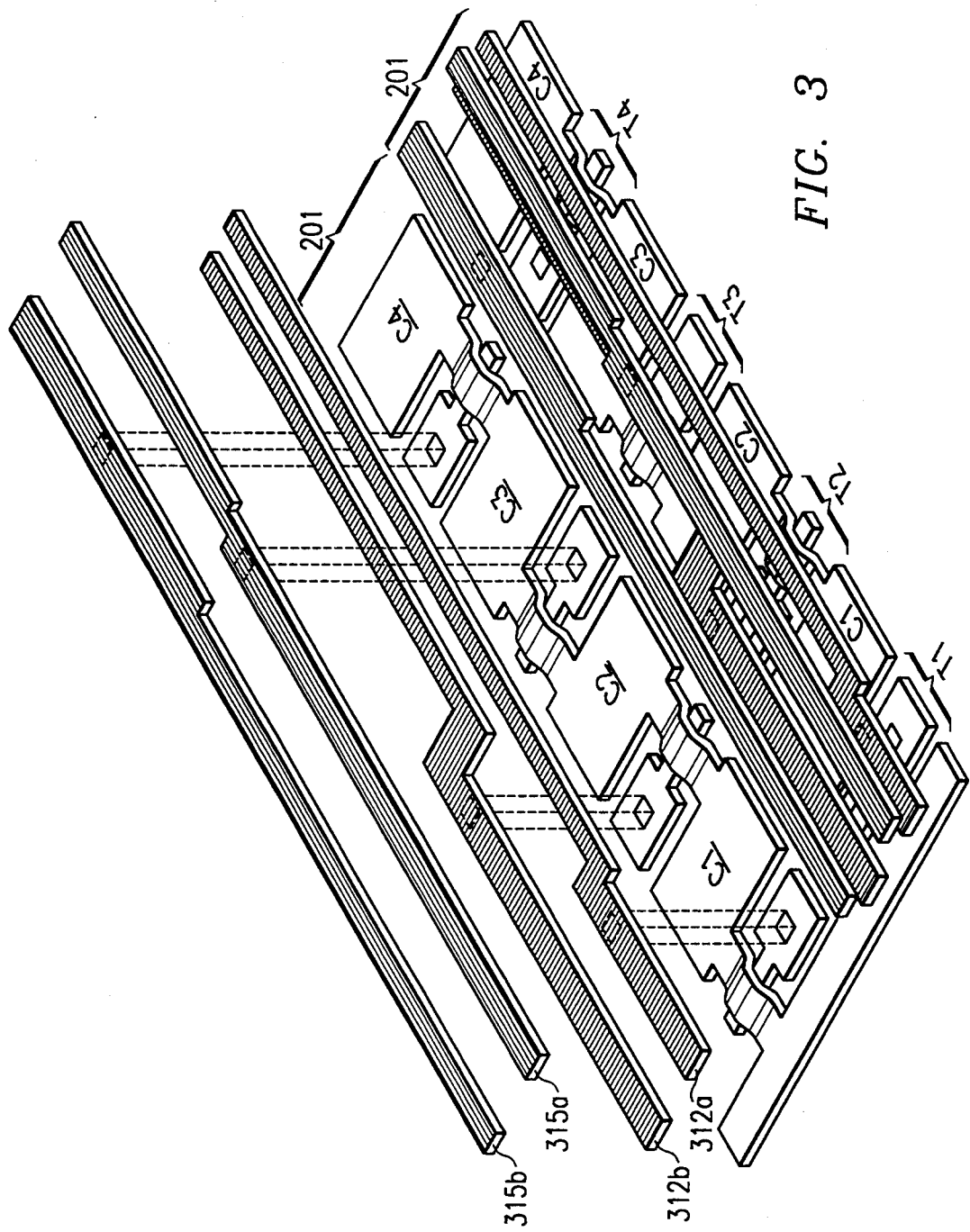
FIG. 3 is a perspective view of a small section of storage location 201.
Figure 4:
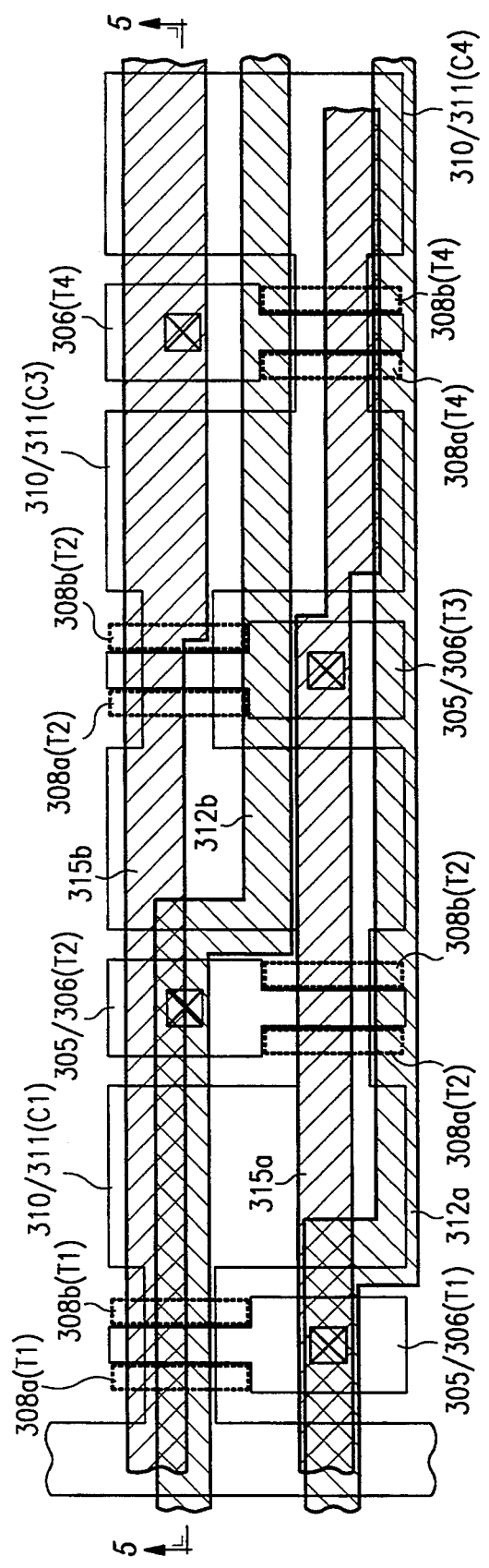
FIG. 4 is a top plan view of a small section of storage location 201.

FIGS. 3 and 4 are respectively perspective and top plan views of a small section of a semiconductor workpiece depicting a preferred fabrication of storage location 201. In the embodiment shown in FIG. 3, two adjacent the storage locations 201 of four storage cells 209 each are depicted, although the number of cells 209 per location 201 may vary in alternate embodiments. Further, while the transistors 210 ($T_1$--$T_4$) of the illustrated embodiment are n-channel devices formed at the face of a p- layer 502 (FIG. 5), it should be understood that the principles of the present invention are not limited thereto and in alternate embodiments a p-channel or twin well CMOS technology may also be used.

Referring to FIG. 4, each transistor 210 includes a gate conductor 306 insulatively spaced from a corresponding channel area of the surface of layer 502 by gate 305 insulator and a pair of source/drain regions 308a and 308b formed on opposite sides of the transistor channel area. Capacitors 211 are formed by a common conductor 311 insulatively spaced from capacitor areas of layer 302 by an insulator 310. The gate conductors 306 of transistors $T_1$ and $T_2$ are connected to either an associated local decoder 212 or row decoder 206 by first level conductive interconnect lines 312a and 312b respectively (in FIG. 3 one storage location 201 is shown in exploded view with interlevel insulators removed for clarity). The gate conductors 306 of transistors $T_3$ and $T_4$ are coupled to either a local decoder 212 or to the row decoder 206 by second level conductive interconnect lines 315a and 315b respectively.

FIGS. 5A–5F are a series of highly enlarged elevational sectional views taken along line 5—5 of FIG. 4 sequentially depicting the fabrication of a selected storage location 201 according to the principles of the present invention. It should be recognized that the portions of storage cell 201 shown being fabricated in FIGS. 5A–5F are being fabricated as part of the fabrication of arrays 202a and 202b and therefore that each step depicted in FIGS. 5A–5F is representative of the simultaneous fabrication of a large number of storage locations 201. While, for illustrative purposes, it has been assumed that each storage location 201 includes four storage cells 209 (i.e. Z=3), the fabrication steps being described herein are equally applicable to the fabrication of alternate embodiments of the present invention in which the number of storage cells 209 per location 201 varies.

Figure 5A:
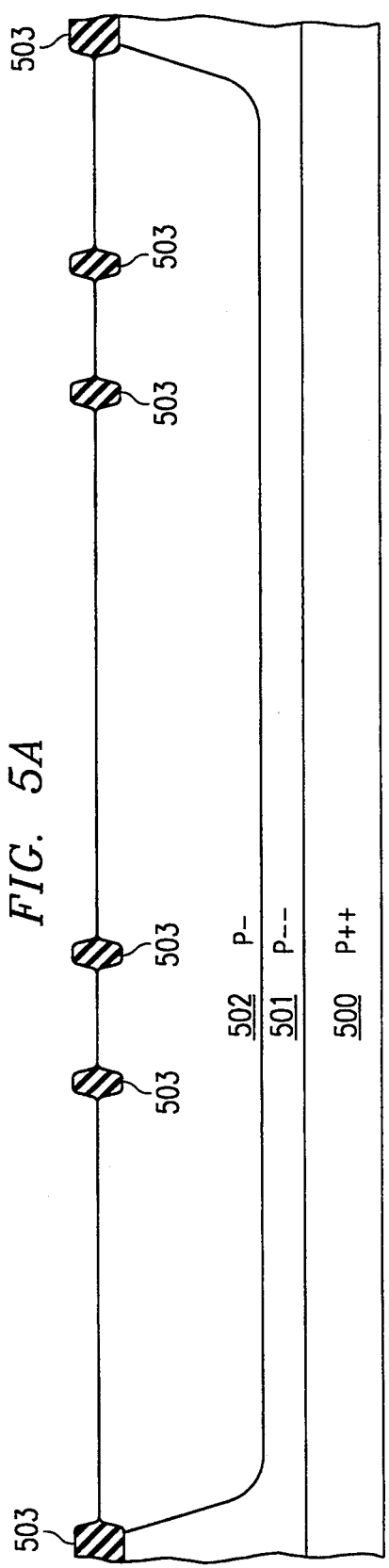

Referring first to FIG. 5A, a P++ substrate 500 is shown having a layer 501 of P-- semiconductor disposed adjacent to a surface thereof. Layer 501 may be formed for example using a conventional epitaxy technique. A p- "well" or "tank" 502 has been formed in layer 501, for example by an implant of boron and a subsequent thermal drive. Tank (well) 502 will eventually contain n-channel transistors. Similarly an n-well (tank) (not shown) is formed by implantation/diffusion (phosphorous) to provide a well for the fabrication of any p-channel transistors needed in system 200 (i.e., a twin well CMOS process is initiated). Isolation oxide regions 503 have been grown by masking and thermal oxidation to define an active regions ("moat") over which transistors 210 and capacitors 209 are to be formed. (These active regions contain both the depicted n-channel active areas and the p-channel active areas).

It should be noted that in alternate embodiments the active areas may be defined using any one of a number of other isolation techniques such as trench isolation or channel stops (implants). Substrate 500 is preferably tied to ground or Vss (0 volts).

In FIG. 5B, the gate oxide layer 305 and conductive gate 306 of each transistor 210 have been formed. These gate oxide 305/gate conductor 306 structures may be formed for example by successively depositing layers of oxide and polycrystalline silicon ("polysilicon") across the face of the workpiece, doping the polysilicon either chemically (CVD, chemical vapor deposition) or by implantation to render it conductive, and then performing a stack etch. In alternate embodiments, where buried contacts are desired between the gate 306 and a given source/drain doped regions 308, the gate oxide regions 306 may be formed by oxide deposition and patterned etching, with gates 306 formed after the formation of transistor source/drain regions 308 described below. Further, in alternate embodiments, gates 306 may be formed from silicided polycrystalline silicon ("polycide"). For example, the polysilicon gate conductors may be silicided with tungsten, molybdenum, tantalum, or titanium.

FIG. 5C depicts the selected portion of the workpiece following the formation of lightly doped (N−) regions 307 and heavily doped (N+) source/drain regions 308a and 308b for each transistor 210. It should be understood that lightly doped p- and heavily doped p+ source/drain implantations are similarly performed at this stage for any p-channel transistors or capacitors. In a given array 202, the source/drain region 308a depicted for first transistor (T1) 210 runs across the face of the workpiece and is shared by the remaining first transistors (T1) 210 of all the locations 201 along the corresponding column of cells to form the associated column line conductor 204 for that column. Lightly doped regions 307 may be formed for example by an implantation of arsenic (for n-channel devices) across the entire workpiece without masking. Source/drain regions 308 can then be formed by masking and implanting with a heavier dose of arsenic. It should be recognized that in alternate embodiments, source/drain regions 308b may be foregone between "overlapping" active regions (e.g., overlapping doubleplay transfer devices). In the preferred embodiment 308b are formed to increase the speed of charge transfer from cell to cell during the read/write operations discussed below. Also, in alternate embodiments, lightly doped regions 307 may not be formed but instead source/drain regions 308 alone formed by masking and implanting and then thermally driving the dopants under the edges of the adjacent gate oxide 305/gate conductor 306 stacks. It should be recognized that capacitors 211 will be formed in regions 509 of the workpiece (FIG. 5D). If the later capacitor conductor 311 is to be tied to Vss (0 volts) then an additional implant of arsenic (to form a natural inversion layer for an n-channel storage array) may be performed into regions 509 at this point.

In FIG. 5D, capacitors 211 are formed depositing layers of oxide 310, to act as the capacitor dielectric, and a layer 311 of polycrystalline silicon across the face of the workpiece. Polysilicon layer 311 is doped to render it conductive, either chemically or by implantation. Polysilicon layer 311 may also be silicided. Oxide layer 310 and polysilicon layer 311 are patterned and etched to define a capacitor plate/dielectric layer which is common to each capacitor 211 in the corresponding array 202a or 202b (FIG. 3). Polysilicon layer (capacitor plate) 311 is coupled to either Vcc (+5 volts) or Vss (0 volts) (connection not shown).

In FIG. 5E, first level interconnect lines 312a and 312b have been formed to provide a connection to the gate conductor 306 of the transistors T1 and T2 of each storage location 201. In the sectional view of FIG. 5E (taken along line 5—5 of FIG. 4) only first level interconnect line 312b connected to the gate conductor 306 of transistor T2 of the selected storage location 201 is visible; both first level interconnect lines 312a and 312b are visible in the views of FIGS. 3 and 4. First level interconnect lines 312 may be fabricated by depositing a layer 513 of insulator across the face of the workpiece, patterning and etching layer 513 to define contacts exposing a portion of each of the gate conductors 306 of each transistor T1 and T2, forming a layer of conductor across the face of the workpiece which extends through the contacts to the exposed portions of gate conductors 306, and patterning and etching the conductor layer to define interconnect lines 312. The conductor used may be a metal (aluminum/silicon, titanium/tungsten, or aluminum/copper to name only a few possibilities) or silicided polysilicon (polycide). Insulator layer 313 may be for example deposited oxide. In the preferred embodiment, interconnect lines 312a runs along the face of the workpiece as row lines 203 which connects each transistor T1 of the corresponding rows in the corresponding array 202 with row decoder 206. Interconnect lines 312b may either run to a local decoder 212 dedicated to the corresponding storage locations 201 or may run across the workpiece as a "sub-row lines" which connect the gate of each of transistors T2 along the corresponding rows with row decoder 206.

Figure 5F:
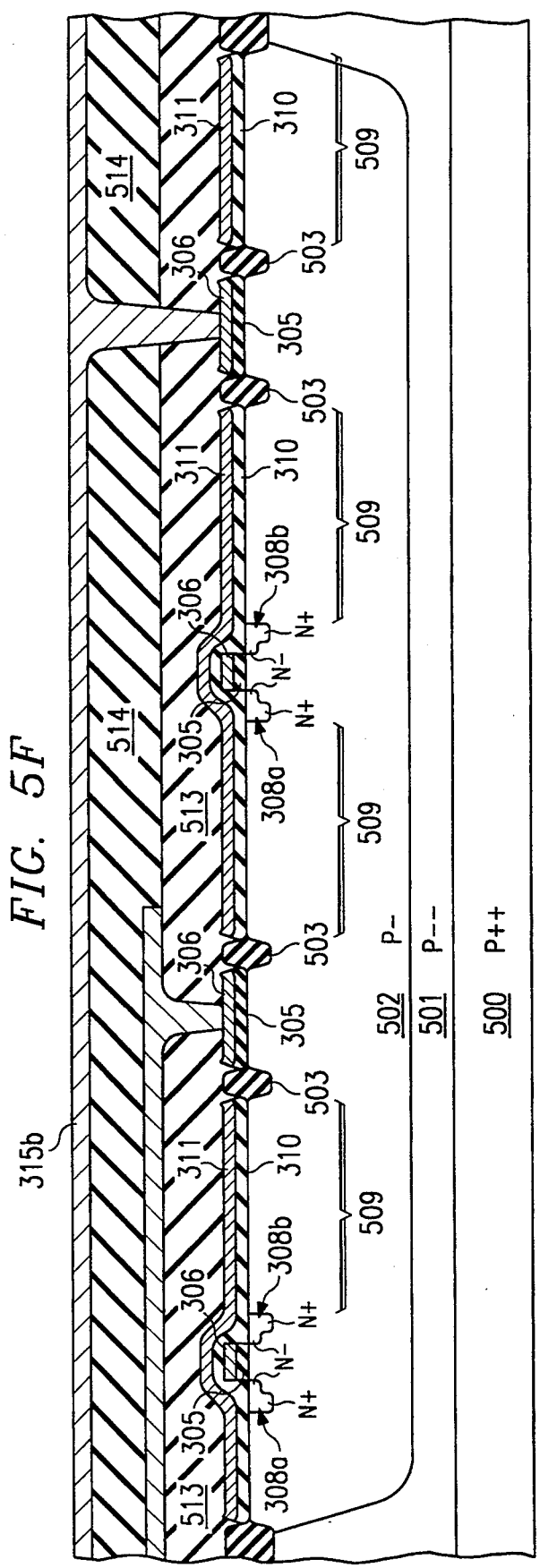

FIG. 5F depicts the workpiece following the formation of second level interconnect lines 315 connecting to the gate conductors 306 of the transistors T3 and T4 of each storage location 201. In the sectional view of FIG. 5E, again taken along line 5—5 of FIG. 4, only second level interconnect 315b connected to gate 306 of transistor T4 of the selected storage location 201 is visible; both second level interconnect lines 315a and 315b are depicted in FIGS. 3 and 4. Second level interconnect lines 315 may be fabricated by depositing a layer 514 of insulator across the face of the workpiece, patterning and etching layer 514 to define contacts exposing portions of the gates 306 of transistors T3 and T4, forming a layer of conductor across the face of the workpiece which extends through the contacts to the exposed portions of gate conductors 306, and patterning and etching the conductor to define interconnect lines 315. As with the first level interconnect lines 312, the conductor may be a metal or silicided polysilicon and the insulator may be a deposited oxide. As discussed above, interconnect lines 315 may run to the local decoder 212 corresponding to the corresponding storage location 201 or may be "sub-row-lines" running along the face of the workpiece to connect the gate of each of the transistors T3 and T4 of each storage location 201 along the corresponding rows in the given array 202 with decoder circuitry 206.

The operation of transistors 210 and capacitors 211 is best illustrated by referring again to the n-channel embodiment of FIGS. 3, 4 and 5. In embodiments where capacitor plate 311 is tied to Vcc (+5 volts) an inversion layer (electron presence) is established near the surface of the underlying capacitor region 509 of tank 302 (the positive voltage on capacitor plate 311 also establishes a depletion layer in region 509 below the inversion layer at the surface). In embodiments in which the capacitor plate 311 is tied to Vss (0 volts) an n-type implant in regions 509 establishes the "inversion layer." When a logic 1 is written into a given cell the electrons establishing the inversion layer at the surface of the corresponding capacitor region 509 are removed and when a logic 0 is written in the inversion layer essentially remains the same. For illustrative purposes, assume a logic 1 is to be written into the second capacitor 211 (C2) of a selected storage location 201. A positive voltage is applied to the corresponding bitline 204 of which the source/drain 308a of transistor T1 of the selected location 201 forms a part. A positive voltage is also applied to the gate conductor 306 of transistor T1 and the electrons in the inversion layer of the capacitor region 509 of the adjacent capacitor C1 are transported towards the activated bitline and thereby removed from capacitor C1. The positive voltage is removed from the gate 306 of transistor T1 and a positive voltage applied to the gate 306 of transistor T2 thereby coupling region 509 of capacitor C1 to capacitor C2 area 509. The electrons at the surface of capacitor C2 area 509 are then removed (transferred into the substrate) to store a logic 1 therein. In a similar fashion charge of appropriate polarity (presence or absence of electrons) can be transferred, when required, to capacitors C3 and C4 from capacitors C1 and C2. It should be understood that a p-channel array will have negative (polarity) voltages and "holes" as the carrier (i.e., the presence or absence of holes).

A similar procedure is used is when a logic 0 is being written into a given capacitor C2 from the corresponding bitline 204. Zero volts are applied to the corresponding bitline 204 of which the source/drain 308a of transistor T1 of the selected storage location 201 forms a part. A positive voltage is applied to the gate conductor 306 of transistor T1 creating a conduction path from the bitline 204 (source/drain 308a) to the C1 capacitor area 509. The charge in capacitor area 509 is modulated appropriately. The positive voltage is removed from the gate 306 of transistor T1, a positive voltage is applied to the gate 306 of transistor T2 and a conductive path created to the capacitor C2 capacitor area 509. As a result, the charge in capacitor C2 is modulated appropriately. In a similar fashion, logic zeroes may be "written" into capacitors C3 and C4.

The processes described immediately above are reversed in the case of a read cycles. This may be accomplished by either sequentially turning on transistors 210, starting with transistor T1 and ending with transistor T4, or by shifting charge from capacitor area 509 to capacitor 509 towards the associated bitline 204.

Figure 6:
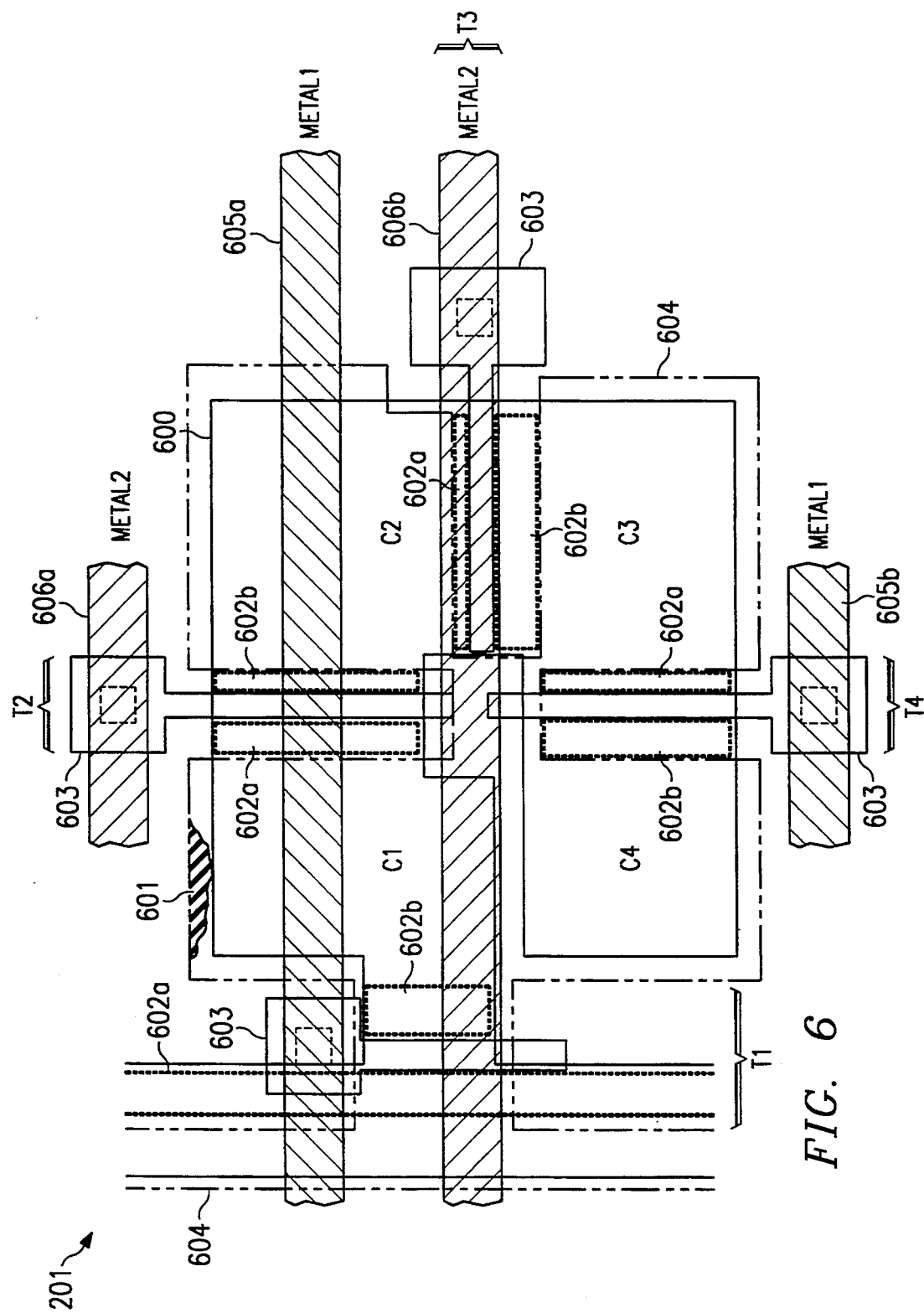
FIG. 6 is a top plan view of an alternative layout of a selected storage location 201.

FIG. 6 is a top plan view of an alternate layout of a selected storage location 201. In the embodiment of FIG. 6, the active semiconductor area (moat) is shown generally within the line designated 600. Moat 600 is defined by an isolation structure, a portion of which is shown at 601. Isolation structure 601 may be for example a field oxide region, a trench, or an appropriate polarity implant. Each transistor 210 (T1-T4) includes a pair of doped source/drain regions 602a and 602b, the source/drain region 602a of transistor T1 forming a part of the bitline conductor 204 of the corresponding column of locations 201. Each transistor 201 also includes a gate conductor 603 disposed insulatively adjacent the channel area between the corresponding source/drain regions 602a and 602b. A capacitor conductor 604 is disposed virtually adjacent the active areas within moat 600 local to the selected storage location 201 and extends along the column to the next adjacent locations 201. Transistors T1 and T4 are coupled either to an associated local decoder 212 or row decoder 206 by first level interconnect lines 604a and 604b respectively. Transistors T2 and T3 are coupled to either an associated local decoder 212 or row decoder 206 by second level interconnect lines 606a and 606b.

What is claimed is:

1. A memory comprising:
   a plurality of storage locations each comprising:
      a plurality of transistors each having a current path and a control input for controlling current flow through said current path, said current paths of said transistors coupled together in series with a data source, at least one of said control inputs coupled to a control signal source remote from said storage location and at least one other of said control inputs coupled to a control signal source local to said storage location; and
      a plurality of capacitors, each said capacitor coupled between preselected voltage and said current path of a corresponding one of said transistors.

2. The memory of claim 1 wherein said transistors comprise field effect transistors.

3. The memory of claim 1 wherein said capacitors comprise inversion layer capacitors.

4. The memory of claim 1 wherein at least one of said control signal sources comprises a row line.

5. The memory of claim 1 wherein at least one of said control signal sources comprises a decoder circuit associated with the corresponding said storage location.

6. The memory of claim 1 wherein said data source comprises a column line.

7. A memory comprising:
   a plurality of multi-bit storage locations disposed in an array of rows and columns;
   a column line associated with each said column of storage locations;
   at least one row line associated with each said row of storage locations;
   a row decoder coupled to said at least one row line;
   wherein each of said multi-bit storage locations comprises:
      a first field effect transistor having a source/drain path coupled to a corresponding said column line and a gate coupled to a corresponding said row line;
      at least one other field effect transistor having a source/drain path coupled in series with said source/drain path of said first transistor and a gate coupled to control signal source local to said storage location; and
      a plurality of data storage capacitors each coupled to said source/drain path of a corresponding one of said transistors; and
   wherein said control signal source local to said storage location is operable to turn-on said at least one other storage to transfer charge between first and second ones of said capacitors while said row decoder is maintaining said first transistor in a turned-off state.

8. The memory of claim 1 wherein said control signal source comprises a local decoder.

9. The memory of claim 7 wherein each said column is coupled to a sense amplifier and column decoder circuitry and each said row is coupled to row decoder circuitry.

10. The memory of claim 7 wherein each said capacitor includes a first plate coupled to said source/drain path of said corresponding transistor and a second plate coupled to a positive voltage.

11. The memory of claim 7 wherein each said capacitor includes a first plate coupled to said source/drain path of said corresponding transistor and a second plate coupled to zero volts.

12. The memory of claim 7 wherein current flow through said source/drain path of each said field effect transistor is enabled by application of a positive voltage to said gate of said transistor.

13. The memory of claim 7 wherein said capacitors comprise inversion layer parallel plate capacitors.

14. A memory system comprising:
an array of multi-bit data storage locations arranged in x number of rows and y number of columns disposed at an angle to said rows:
 a plurality of bitlines, each said bitline associated with a said column of storage locations;
 a plurality of wordlines, at least one said wordline associated with each said row;
 column decoder circuitry coupled to each of said bitlines;
 sense amplifier circuitry coupled to each of said bitlines;
 row decoder circuitry coupled to each of said wordlines; and
 wherein each of said multi-bit storage locations comprises:
  z number of transistors each having a source/drain path and a gate, said source/drain paths of said transistors coupled in series with said bitline of the corresponding said column, said gate of a first said transistor coupled to said wordline associated with the corresponding said row and said gates of other ones of said transistors receiving a separate control signal;
  z number of capacitors, each said capacitor coupled to a preselected voltage and coupled to said source/drain path of a corresponding one of said transistors;
  a local decoder for providing said separate control signals to said gates of said other ones of said transistors to control shifting of charge between selected ones of said capacitors while said capacitors are isolated from said bitline by said first transistor.

15. The system of claim 14 wherein each said storage location is associated with a separate local decoder.

16. The system of claim 14 wherein each said row is associated with a plurality of wordlines, said wordlines associated with a selected said row providing said separate control signals to said transistors.

17. The system of claim 14 wherein said array is partitions into a plurality of subarrays.

18. A memory comprising:
a plurality of wordlines;
a plurality of bitlines; and
an array of rows and columns of multi-bit storage locations, each said location comprising a plurality of cells for storing data presented on an associated said bitline in response to a plurality of control signals, at least a first one of said storage cells of each said locations receiving a said control signal from an associated said wordline and at least one other of said cells receiving a said control signal from a decoder local to the corresponding said location, said local decoder for transferring data between cells within the corresponding said location in isolation from said corresponding bitline.

19. The memory of claim 18 wherein said storage cells comprise:
a plurality of transistors each having a current path and a control input for controlling current flow through said current path, said current paths of said transistors coupled together in series with a data source and each of said control inputs coupled to a separate control signal source; and
a plurality of capacitors, each said capacitor having a first plate coupled to a preselected voltage and a second plate coupled to said current path of a corresponding one of said transistors.

20. A method writing data to first and second cells of a multi-cell data storage location including a plurality of transistors having current paths coupled together in series, each of the transistors further including a control signal input, and a plurality of capacitors, each capacitor coupled to a preselected voltage and to the current path of a corresponding one of the transistors, the method comprising the steps of:
 presenting the voltage a first bit of data to the current path of a first one of the transistors;
 applying a voltage to the control input of the first transistor to transfer the voltage of the first bit to a first one of the capacitors;
 removing the voltage applied to the control input of the first transistor;
 applying a voltage to the control input of a second transistor, the current path of the second transistor coupling the first capacitor with a second one of the capacitors, to transfer the voltage of the first bit from the first capacitor to the second capacitor;
 removing the voltage applied to the control input of the second transistor;
 applying a control voltage to the control input of the first transistor; and
 presenting the voltage of a second bit of data to the current path of the first transistor for transfer to the first capacitor.

21. A method reading data from first and second cells of a multi-cell data storage location including a plurality of transistors having current paths coupled together in series, each of the transistors further including a control signal input, and a plurality of capacitors, each capacitor coupled to a preselected voltage and to current path of a corresponding one of the transistors, a voltage representing a first bit stored on a first one of the capacitors and a voltage representing a second bit stored on a second one of the capacitors the method comprising the steps of:
 applying a voltage to the control input of the first transistor to transfer the voltage of the first bit from the first capacitor through the current path of the first transistor;
 sensing the change in voltage on a bitline coupled to the current path of the first transistor;
 removing the voltage applied to the control input of the first transistor such that the voltage of the first bit is transferred from the second capacitor to the first capacitor;
 applying a voltage to the control input of the second transistor to transfer the voltage of the second bit from the second capacitor through the current path of the second transistor;

removing the voltage applied to the control input of the second transistor after the voltage of the second bit has been transferred to the first capacitor;

applying a voltage to the control input of the first transistor to transfer the voltage of the second bit from the first capacitor through the current path of the first transistor; and sensing the change in voltage on the bitline.

* * * * *